United States Patent
Ellä et al.

(10) Patent No.: US 10,270,582 B2
(45) Date of Patent: Apr. 23, 2019

(54) DUPLEXER HAVING IMPROVED REFLECTIVITY

(71) Applicant: SNAPTRACK, INC., San Diego, CA (US)

(72) Inventors: Juha Ellä, Halikko (FI); Edgar Schmidhammer, Stein an der Traun (DE)

(73) Assignee: SnapTrack, Inc., San Diego, CA (US)

( * ) Notice: Subject to any disclaimer, the term of this patent is extended or adjusted under 35 U.S.C. 154(b) by 39 days.

(21) Appl. No.: 15/315,365

(22) PCT Filed: Jun. 15, 2015

(86) PCT No.: PCT/EP2015/063339
§ 371 (c)(1),
(2) Date: Nov. 30, 2016

(87) PCT Pub. No.: WO2016/015914
PCT Pub. Date: Feb. 4, 2016

(65) Prior Publication Data
US 2017/0201369 A1 Jul. 13, 2017

(30) Foreign Application Priority Data
Jul. 31, 2014 (DE) ........................ 10 2014 110 905

(51) Int. Cl.
*H04L 5/14* (2006.01)
*H03H 9/70* (2006.01)
(Continued)

(52) U.S. Cl.
CPC ........... *H04L 5/1461* (2013.01); *H03H 9/706* (2013.01); *H03H 9/725* (2013.01); *H04B 1/401* (2013.01);
(Continued)

(58) Field of Classification Search
CPC ....... H04L 5/1461; H03H 9/725; H04B 1/401
See application file for complete search history.

(56) References Cited

U.S. PATENT DOCUMENTS

| | | | |
|---|---|---|---|
| 9,294,065 B2 | 3/2016 | Krems et al. | |
| 2006/0267708 A1* | 11/2006 | Matsuda | ................ H03H 9/568 333/133 |

(Continued)

FOREIGN PATENT DOCUMENTS

| | | |
|---|---|---|
| DE | 102010055669 A1 | 6/2012 |
| EP | 2530837 A1 | 12/2012 |

(Continued)

OTHER PUBLICATIONS

International Search Report and Written Opinion—PCT/EP2015/063339, International Search Authority—European Patent Office, dated Sep. 29, 2015.

*Primary Examiner* — Zhiren Qin
(74) *Attorney, Agent, or Firm* — Patterson & Sheridan, L.L.P.

(57) ABSTRACT

A duplexer and a quadplexer are disclosed. In an embodiment, the duplexer includes an antenna terminal and two sub-paths including a transmit path and a receive path, the two sub-paths being connected to the antenna terminal, wherein the transmit path includes serially interconnected series resonators and, in parallel therewith, n parallel paths connected to ground, wherein each parallel path includes one parallel resonator or a cascade of serially interconnected parallel resonators, wherein n is an integral number with 0<n<8, wherein at least one of the n parallel resonators is connected to ground in series with an inductance in the transmit path, and wherein a parallel resonator is connected directly to ground in a first parallel path that is nearest to the antenna terminal and no inductance is arranged in the first parallel path.

9 Claims, 10 Drawing Sheets

(51) Int. Cl.
  *H03H 9/72* (2006.01)
  *H04B 1/401* (2015.01)
  *H04B 1/44* (2006.01)
  *H04L 5/04* (2006.01)
  *H03H 9/64* (2006.01)

(52) U.S. Cl.
  CPC .............. *H04B 1/44* (2013.01); *H04L 5/04* (2013.01); *H03H 9/6483* (2013.01)

(56) References Cited

U.S. PATENT DOCUMENTS

| | | | |
|---|---|---|---|
| 2007/0173210 A1 | 7/2007 | Cho | |
| 2008/0042778 A1 | 2/2008 | Jamneala et al. | |
| 2010/0188166 A1* | 7/2010 | Hara | H03H 9/542 |
| | | | 333/133 |
| 2011/0210787 A1* | 9/2011 | Lee | H03F 1/56 |
| | | | 330/126 |
| 2011/0210805 A1* | 9/2011 | Link | H03H 9/547 |
| | | | 333/134 |
| 2011/0248794 A1* | 10/2011 | Klamm | H03H 9/725 |
| | | | 333/133 |
| 2012/0286896 A1 | 11/2012 | Takamine | |
| 2013/0147578 A1* | 6/2013 | Hara | H03H 9/605 |
| | | | 333/133 |
| 2013/0176912 A1* | 7/2013 | Khlat | H04L 5/14 |
| | | | 370/277 |
| 2013/0176914 A1* | 7/2013 | Khlat | H04B 1/44 |
| | | | 370/278 |
| 2013/0273860 A1 | 10/2013 | Pehlke | |
| 2013/0335164 A1* | 12/2013 | Maurer | H03H 9/605 |
| | | | 333/133 |
| 2014/0003300 A1 | 1/2014 | Weissman et al. | |
| 2014/0010122 A1* | 1/2014 | Krems | H03H 9/6483 |
| | | | 370/277 |
| 2014/0313947 A1* | 10/2014 | Ali-Ahmad | H04L 5/18 |
| | | | 370/278 |
| 2015/0188512 A1* | 7/2015 | Michigami | H03H 9/0576 |
| | | | 333/133 |
| 2016/0173062 A1* | 6/2016 | Takamine | H03H 9/6433 |
| | | | 333/133 |

FOREIGN PATENT DOCUMENTS

| | | |
|---|---|---|
| JP | 201300500 A | 1/2013 |
| WO | WO-2011092879 A1 | 8/2011 |
| WO | 2012084741 A1 | 6/2012 |
| WO | WO-2014169954 A1 | 10/2014 |

\* cited by examiner

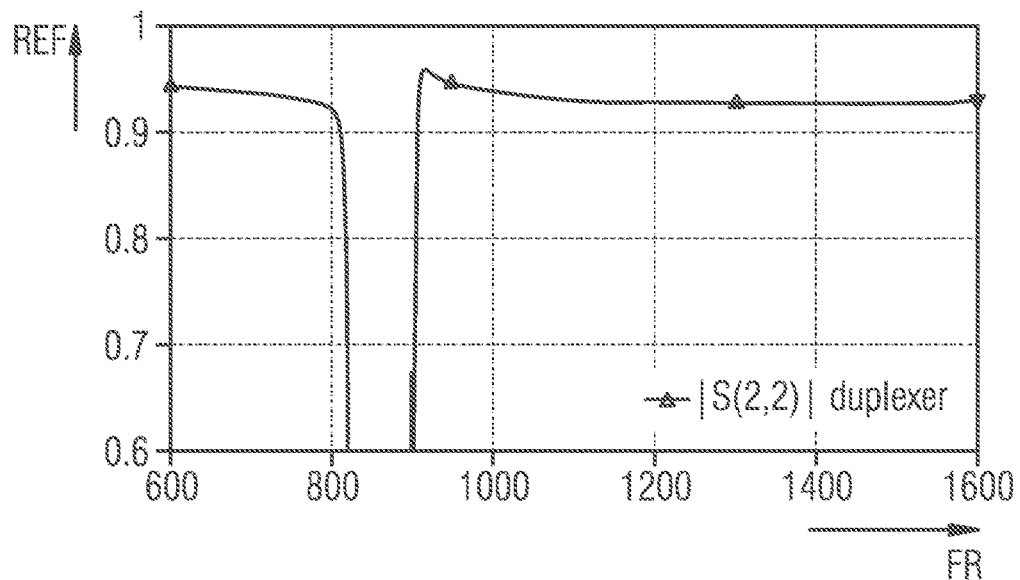
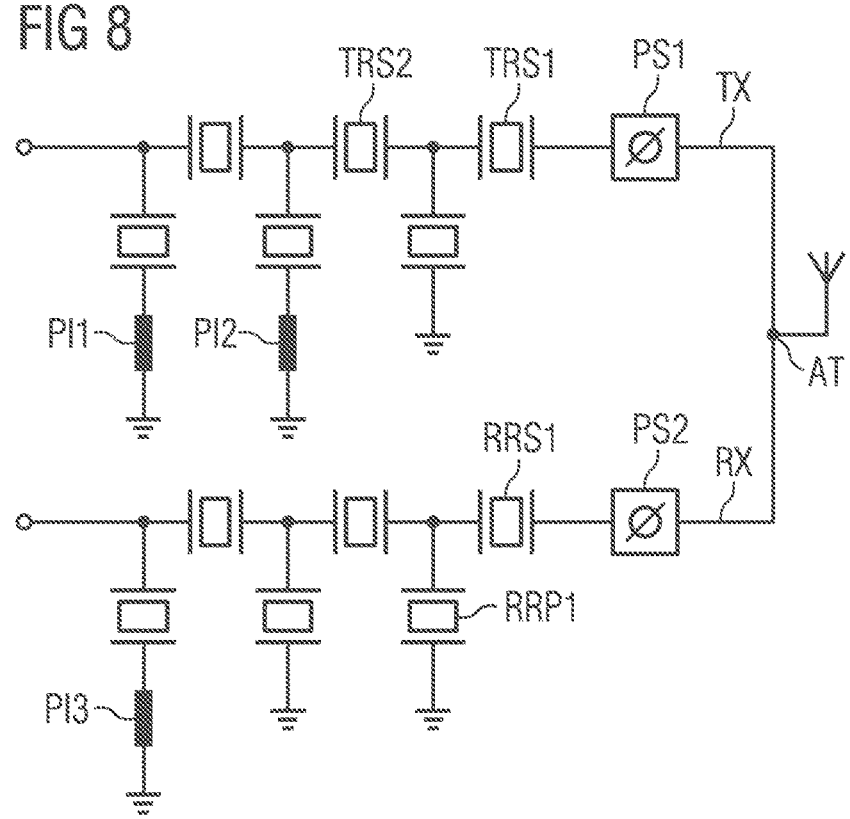

FIG 15A

| LB+LB | LB+MB | MB+MB | MB+HB | LB+HB | HB+UB | LB+MB+HB | LB+2xMB | 2xLB+MB | 3xMB | 2xLB+HB | HB+2xMB | 2xMB+2xHB |
|---|---|---|---|---|---|---|---|---|---|---|---|---|
| 5+17 | 1+5 | 2+4 | 3+7 | 7+20 | 7+22 | 2+5+30 | 2+2+13 | 12+12+2 | 2+2+4 | 4+8+20+7 | 3+3+7 | 3+7+7 |
| 5+12 | 4+17 | 1+3 | 4+7 | 5+7 | | 2+17+30 | 4+4+13 | 12+12+4 | | | 4+4+7 | |
| 8+20 | 4+13 | 1+11 | 1+7 | 7+28 | | 4+5+30 | 2+4+13 | 4+5+12 | | | | |
| 8+27 | 4+12 | | 2+30 | 5+30 | | 4+17+30 | 1+3+8 | 3+8+27 | | | | |
| 5+13 | 2+17 | | 4+30 | 17+30 | | 2+29+30 | 2+4+5 | 2+5+12 | | | | |
| | 4+5 | | | 29+30 | | 2+29+30 | 2+4+12 | 2+5+13 | | | | |
| | 3+20 | | | 12+30 | | 1+7+20 | 1+3+6 | 4+5+13 | | | | |
| | 3+5 | | | | | 1+5+7 | 1+3+20 | 1+18+28 | | | | |
| | 11+18 | | | | | 3+7+20 | 1+19+21 | | | | | |
| | 1+18 | | | | | 2+12+30 | 1+3+19 | | | | | |
| | 1+19 | | | | | 4+12+30 | 4+4+12 | | | | | |
| | 1+21 | | | | | 4+7+12 | 2+2+5 | | | | | |
| | 3+8 | | | | | | 4+4+5 | | | | | |
| | 2+29 | | | | | | 1+3+26 | | | | | |
| | 4+29 | | | | | | 2+2+12 | | | | | |
| | 23+29 | | | | | | 3+3+8 | | | | | |
| | 3+26 | | | | | | | | | | | |
| | 3+19 | | | | | | | | | | | |
| | 1+8 | | | | | | | | | | | |
| | 3+28 | | | | | | | | | | | |
| | 1+26 | | | | | | | | | | | |
| | 2+12 | | | | | | | | | | | |
| | 2+13 | | | | | | | | | | | |
| | 19+21 | | | | | | | | | | | |
| | 12+25 | | | | | | | | | | | |
| | 2+5 | | | | | | | | | | | |
| | 5+25 | | | | | | | | | | | |
| | 8+11 | | | | | | | | | | | |
| | 4+27 | | | | | | | | | | | |
| | 3+27 | | | | | | | | | | | |
| | 1+28 | | | | | | | | | | | |

LB < 1GHz
1GHz < MB < 2.2GHz
2.2GHz < HB < 3GHz
UB > 3GHz

LowBand
MidBand
HighBand
UltrahighBand

FIG 15B

| LB+LB | LB+MB | MB+MB | MB+HB | LB+HB |
|---|---|---|---|---|
| 5+12 | 3+5 | 1+21 | 1+7 | 7+20 |
| 5+17 | 1+5 | 2+4 | 3+7 | 7+28 |
| | 3+20 | 1+3 | 4+7 | 5+7 |
| | 1+19 | | | |
| | 3+8 | | | |
| | 4+12 | | | |
| | 4+17 | | | |
| | 3+26 | | | |
| | 3+19 | | | |
| | 19+21 | | | |
| | 2+13 | | | |
| | 4+13 | | | |

FIG 15C

| MB+HB | MB+2xHB | MB+2xUB |
|---|---|---|
| 39+41 | 39+41+41 | 41+42+42 |

DUPLEXER HAVING IMPROVED REFLECTIVITY

This patent application is a national phase filing under section 371 of PCT/EP2015/063339, filed Jun. 15, 2015, which claims the priority of German patent application 10 2014 110905.8, filed Jul. 31, 2014, each of which is incorporated herein by reference in its entirety.

BACKGROUND

The LTE-A Standard (Long Term Evolution-Advanced) enables a mobile telephone to operate in a so-called carrier aggregation mode (=CA Mode) in order to utilize a higher bandwidth in the downlink and/or in the uplink and thus to achieve a faster uplink or downlink speed. The Carrier Aggregation Mode is defined both for FDD (Frequency Division Duplexing) and for TDD (Time Division Duplexing) bands and enables two bands to be utilized simultaneously, for example, in downlink mode (receiving mode) for a conversational or data connection. According to Standard 3 GPP TS 36.101, a series of so-called interband carrier aggregation pairs are already defined by 3GPP. A list of the band combinations currently discussed and partially already examined is given in FIG. 15. For example, according to a proposed CA combination, a mobile telephone can receive in band 20 and additionally receive in band 7 (RX-CA). Similarly, it is possible that transmission occurs in bands 20 and 7 and reception occurs either in band 7 or band 20 (RX-CA). The defined carrier aggregation band pairs are then related to bands, to the application for Rx or Tx mode and to the duplex mode, i.e., to FDD and TDD.

To meet the requirements for the CA mode, the corresponding duplexers should be able to be active at the same time in the front-end circuit of the mobile telephone without interfering with one another. If, however, two duplexers are connected to the same antenna terminal, this, as a rule, represents a quadplexer which must be optimized for this special application as a new component.

Overall, it is technically simple to implement those of the proposed band pairs of which the bands are far enough apart in frequency, for example, bands 20 and 3. These can be combined at a common antenna terminal with a simple duplexer which exhibits good isolation of, typically more than 20 dB. In this manner, it is possible to ensure that the duplexers connected to the common antenna terminal do not interfere with one another so that a signal is conducted exclusively via the required duplexer and does not generate any unnecessary losses in the other duplexer.

In addition to the low loss, a quadplexer must have good isolation between TX and RX subbands, that is to say between the corresponding transmitting and receiving bands. This applies both to the TX/RX isolation within the same band and between the TX mode and of the first band and the RX mode of the combined second band. These requirements are already met for the cases in which a diplexer can be used.

In the cases of proposed CA band pairs, however, in which the frequencies of the bands are close to one another, for example, in the cases of the CA band combinations 5 & 17, 8 & 20 or 2 & 4, conventional diplexers cannot be combined simply at the antenna terminal. In these cases, the isolation between low-pass and high-pass of the diplexer is not adequate for mutual isolation of the bands and the duplexers must be directly matched to one another. For this purpose, in the passband of one duplexer the impedance must appear to be infinite at the antenna terminal of the other duplexer, which usually requires a corresponding phase rotation of the impedance. The duplexer, therefore, must have a high reflection coefficient at the antenna terminal for frequencies of the other band, that is to say outside its passband. This can be achieved by the impedance being rotated towards infinity with the aid of a phase shifter in the same frequency band.

FIG. 1 shows an arrangement, known per se, of a first and second duplexer DPX1, DPX2 which are connected to a common antenna terminal AT. Between antenna terminal AT and the input of each duplexer, a phase shift circuit PS1, PS2 is arranged in each case which is intended to rotate the impedance in the passband of the other duplexer in each case towards infinity.

Typically, the TX filter (transmit filter) is designed as a reactance filter with ladder-type arrangement in the duplexers which is constructed from both serially and parallel interconnected resonators. The resonators can be constructed as SAW or BAW resonators. The respective RX filter (receive filter) can also have other filter components apart from the ladder-type structure, for example, acoustically coupled resonator structures such as, for example, DMS structures.

The transfer characteristic of a ladder-type filter has three different characteristic sections: the out-of-band suppression, the depth of the poles or attenuation peaks on both sides of the passband and the passband itself. The individual duplexer itself uses advantageously characteristic deep poles (notches) in the transfer characteristic in order to achieve a very high attenuation between the TX section and the RX section. While the frequency of the pole below the passband is determined, as a rule, by the resonant frequency of the parallel resonators, the frequency of the pole above the passband is determined by the antiresonant frequency of the parallel resonators and the resonant frequency of the series resonators. In addition, the series resonance of the series resonators must be within the passband, naturally, as does the antiresonance of the parallel resonators.

To optimize the precise position of attenuation peaks relative to the passband or to increase the bandwidth of the resonators, it is known to connect inductances in series with the parallel resonators. This makes it possible to create further poles in the filter response. Since the additional inductances, however, have a limited quality factor (Q factor), an interconnection with these inductances leads to additional insertion loss in the passband. In addition, and this is even more serious, the inductances reduce the reflectivity of the duplexers considerably in the case of out-of-band frequencies further away from the passband. In most cases, this does not cause any interference as long as the duplexer is operated in single mode, that is to say not in CA mode. However, the reduced reflectivity becomes a considerable problem if the duplexer is operated as part of a quadplexer since the lower reflectivity of the duplexer can then have a direct and negative effect on the insertion loss in the other duplexer at certain frequencies.

FIG. 2 shows a simulation of how the insertion loss IL of a filter or duplexer is additionally increased by an inductance which is connected in a parallel branch, as a function of the reflectivity REF at the corresponding antenna terminal. It is found that with a reflectivity from 0.8 and less a serious impairment of the duplexer characteristics must be expected. Even if the duplexers are matched perfectly, and have ideal, that is to say lossless matching elements for matching to the common antenna terminal, a reflectivity of 0.8 would even in this ideal case lead to a loss of approximately 0.45 dB in the passband as shown by curve K1. Each worsening of the matching would then lead to even higher reflectivity and correspondingly higher losses. A reflectivity of 0.6 more would lead to more than 1 dB increased insertion loss. The situation becomes worse if the antenna terminal has a poorer reflection coefficient (S22) which is shown by the other curves in the figure.

FIG. 3 shows by means of a simulation the reflection coefficient REF, plotted against the frequency FR, of a duplexer at the antenna terminal as a function of the quality factor Q of the inductance used which is plotted for values of Q=50 (bottom curve) to Q=300 (top curve). It is found that the quality factor also has a considerable influence on the reflectivity and thus on the insertion loss. The values shown in the figure are calculated for a duplexer which has in the first parallel branch an inductance in series with the parallel resonator, that is to say in the parallel branch which is located nearest to the antenna terminal in the interconnection of the branches. A further duplexer, the band of which is either below or above the passband shown, will have high losses due to the poor reflectivity. This effect cannot be eliminated even by an ideal coil or subsequent matching elements.

Apart from the disadvantage with respect to the increased reflectivity, the inductance also shows an advantage in that it improves the RX/TX insulation in the passband of the RX filter. Considering also the individual duplexer, the insertion loss is reduced only insignificantly by an inductance having a quality factor of 50.

SUMMARY OF THE INVENTION

Embodiments of the invention provide a duplexer which has both the good RX/TX insulation but which can be designed for operation in a quadplexer and which is improved with respect to its reflectivity at the joint antenna port.

Embodiments of the invention show that in a filter the selection of the parallel path in which the inductance is connected has a significant influence on the reflectivity of the filter. It has been found that the conventional arrangement of inductance in a parallel path in direct neighborhood to the antenna terminal is the most disadvantageous one. The invention then shows that the most advantageous arrangement of the inductance is a series interconnection with the parallel resonator which is arranged in the parallel arm which is removed furthest from the antenna terminal.

The first parallel arm, seen from the antenna terminal, of the duplexer according to the invention must then be connected directly to ground. It is also advantageous to connect the other parallel arms directly to ground, with the exception of the arm furthest away from the antenna terminal.

A duplexer according to embodiments of the invention has an antenna terminal which is connected to two subpaths, namely a transmit path and a receive path. In the transmit path, serially interconnected series resonators are arranged, n parallel paths being connected to ground in parallel therewith. In each parallel path, a parallel resonator or a cascade of serially interconnected parallel resonators is arranged in each case. For the number n, preferably 0<n <8. More than 8 parallel branches are also possible, this normally not being required, however, or being advantageous and in most cases a maximum of five parallel branches are also sufficient. In at least one parallel path, an inductance is connected to ground in series with a parallel resonator, the parallel arm which is nearest the antenna terminal being connected directly to ground because there is no inductance arranged in it.

In the duplexer according to embodiments of the invention, the TX/RX insulation essentially corresponds to that of a known duplexer with an inductance at the first parallel arm at frequencies around the passband but the reflectivity is now significantly better and the duplexer indicates a lower dependence on the Q factor of the inductance. This has the advantage that no high-value inductances are required in order to achieve the desired characteristics.

A duplexer according to embodiments of the invention can have a number of inductances which are connected in series with respect to different parallel arms of the duplexer. This is of advantage especially when additional notches are to be generated in the out-of-band range of the filter in order to suppress interferences at certain system frequencies. Such system frequencies are those which can be operated additionally to the bands of the duplexer and, if necessary, of the quadplexer composed of two duplexers in the mobile telephone.

It also applies to a number of such inductances that they are arranged in maximum distance from the antenna terminal in the ladder-type circuit. In this context, the measure of connecting the first parallel resonator, that is to say the parallel resonator in the first parallel arm (seen from the antenna terminal) directly to ground and to arrange no inductance in this parallel arm already shows the greatest effect but is improved even further where the inductance is arranged in the parallel arm which is furthest removed from the antenna terminal.

According to one embodiment, a first duplexer according to the invention is designed for a first transmit band and a first receive band. At the antenna terminal, a second duplexer is connected which is designed for a second transmit band and a second receive band, the bands of the first and second duplexer being different. Between the antenna terminal and the first duplexer and between the antenna terminal and the second duplexer, a phase shifter circuit is arranged in each case which rotates the impedance for the frequencies of the one transmit and/or receive band in the other duplexer in each case towards infinity. It also applies for the second duplexer that its transmit path comprises serially interconnected series resonators and, branching away from these, parallel paths connected to ground in which in each case a parallel resonator or a cascade of serially interconnected parallel resonators is arranged. At least one of the parallel paths on the transmit path is connected to ground in series with an inductance, the parallel path which is nearest the antenna terminal having a parallel resonator which is connected directly to ground so that no inductance is arranged in the corresponding parallel path.

This embodiment represents a quadplexer which exhibits a clean isolation or, respectively, good isolation between the two duplexers even in the case of closely adjacent, but still different bands.

The use of such quadplexers is meaningful or advantageous up to only a certain maximum spacing of the connected bands since pairs of bands of a quadplexer, which are further removed, can be separated without problems with the aid of a diplexer. Nevertheless, the quadplexer according to the invention can also separate these pairs of bands.

If the first duplexer is designed for band X and a second duplexer for band Y, and if $f_{C1}$ is the center frequency in the receive band of band X and $f_{C2}$ is the center frequency in the receive band of band Y, it is considered to be a limit if $f_{C1}$ and $f_{C2}$ are linked via the relation $f_{C1} \leq 1.45\ f_{C2}$.

In an advantageous embodiment, $f_{C1}$ and $f_{C2}$ are linked via the relation $f_{C1} \leq 1.30\ f_{C2}$.

In a further advantageous embodiment, $f_{C1}$ and $f_{C2}$ are linked via the relation $f_{C1} \leq 1.20 \, f_{C2}$. This small spacing of the bands to be separated also results in an excellent isolation.

Due to the inductance arranged according to the invention, the quadplexer according to the invention is also improved in its reflectivity and can thus be operated without problems in a CA mode in which, additionally to the TX and RX mode of a band, at least one further one from the additional transmit band and/or additional receive band is active in order to increase the data rate or the bandwidth, respectively, during a conversational or data connection. The inductance makes it possible to improve the TX/RX isolation not only in a duplexer but also in the quadplexer without adversely affecting the reflectivity. In addition, it is possible to use inductances having small Q factors, that is to say cost-effective components, since the dependence of the duplexers or respectively the dependence of the quadplexer characteristics on the Q factor of the inductances is only very low or not defined at all, respectively.

Since the Tx/Rx insulation and the insulation between the two connected bands are significantly improved with the invention, the bands can be operated with an arbitrary duplex method in a quadplexer according to the invention. It is also possible to use different duplex methods within the quadplexer for the two bands or the two connected duplexers, respectively. It is possible to combine an FDD method in the first duplexer with a TDD method in the second duplexer or a sub-filter of the second duplexer, respectively. This also applies to CA combinations of two Rx bands and two Tx bands heretofore not yet implemented but conceivable which require a full quadplexer operation for a single communication connection which is possible with the duplexers according to the invention.

In one embodiment, a further inductance is connected in series with another parallel resonator in one of the two duplexers in a further parallel arm. The value of the inductance of this further inductance is dimensioned such that a further loss pole is obtained which leads to an increased loss at a further system frequency. In this manner, it is possible to cut out a system frequency used by the mobile telephone in the transmission characteristic of the duplexer. Such system frequencies to be filtered out can be allocated to a Tx or Rx band of any other communication or navigation band such as GSM, WCDMA, GPS GLONASS, Galileo, Bluetooth, W-Lan, WiFi, or IoT (Internet of Things) and/or to a DBT frequency. In principle, it is possible in this way to generate any other poles, or to displace the other poles to arbitrary frequencies in order to protect the duplexer against disturbing influences at these system frequencies. Usually, but not generally, the number of poles is limited by the number of cross or parallel branches in the filter.

According to one embodiment, a duplexer according to the invention is coupled to an antenna or to an antenna terminal, respectively, to which at least one further transmit branch with a further transmit filter or a further receive branch with a further receive filter or a second duplexer is coupled. Between the antennas and the further transmit branch or between the antenna and the further receive branch, at least one phase shifter is arranged which rotates the impedance for frequencies of the other transmit branch in each case and/or the other receive branch of the second duplexer towards infinity at the input of the first duplexer or which rotates the impedance for frequencies of the transmit filter of the duplexer towards infinity in the further receive branch. The entire arrangement with the first duplexer and the further branch is designed for operation in a carrier aggregation mode. This provides for transmitting and receiving operation at the same time via the transmitting and receive path of the duplexer and, in addition, receiving operation via the further receive filter or receiving or transmitting operation via the receive filter or the transmit filter of the second duplexer. The phase shifter guarantees that no interfering transmit frequencies can reach the receive path of a receive filter coupled to the same antenna terminal or the receive subfilter of a duplexer. This provides for a multiplex function also of mutually closely adjacent frequencies of the branches to be separated. Furthermore, high reflectivity is generated so that both filters can be designed optimally with regard to their insertion loss.

In one embodiment, a first and a second duplexer is coupled to the common antenna. The first duplexer is designed for the LTE band 5 while the second duplexer is designed for the LTE band 17. In this embodiment, an inductance can be used as phase shifter which is connected to ground in parallel with the antenna terminal and thus in parallel with the antenna. In this embodiment, the function of a phase shifter is implemented already with this single element. In this context, the element has the desired effect for the signals of both duplexers in that it rotates the impedances of frequencies of the other duplexer in each case towards infinity. For other band combinations in the carrier aggregation mode in which two duplexers are connected to a common antenna, additional elements may be required for the at least one phase shifter circuit.

BRIEF DESCRIPTION OF THE DRAWINGS

In the text which follows, the invention will be explained in greater detail by means of exemplary embodiments and the associated figures. The figures are created purely diagrammatically and only used for better understanding so that the presentation of unimportant or self-evident details can be omitted.

FIG. 7 shows, similarly to FIG. 3, the variation of the reflectivity with the frequency plotted in dependence on different quality factors of a duplexer according to the invention.

FIG. 8 shows a duplexer according to the invention, having an additional loss pole.

FIGS. 15A to 15C show tables with proposed band combinations for an operation in the carrier aggregation mode according to 3GPP.

DETAILED DESCRIPTION OF ILLUSTRATIVE EMBODIMENTS

Figure 1:
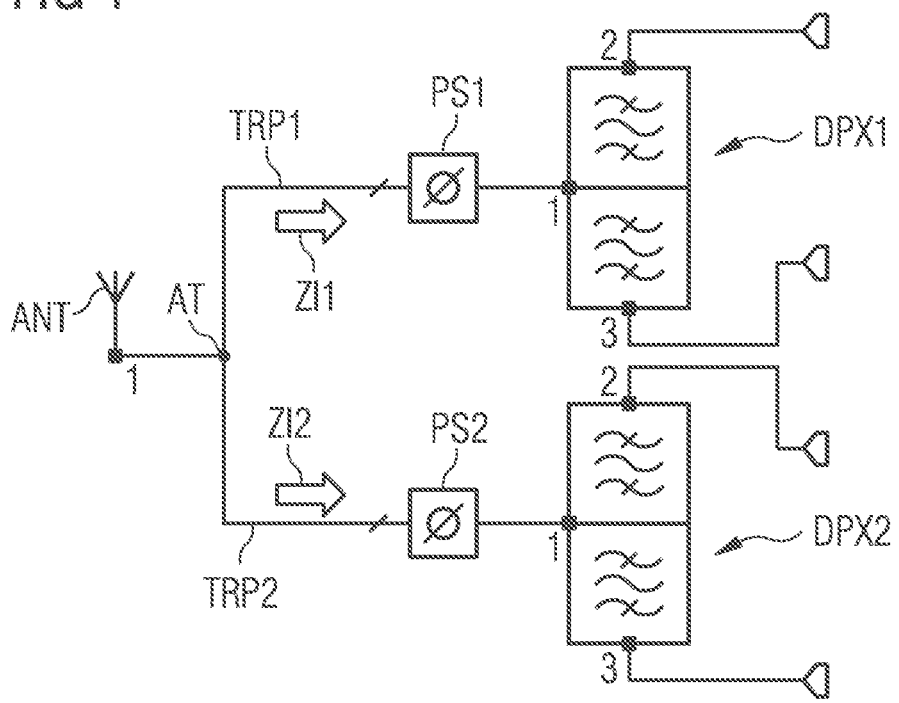
FIG. 1 shows a quadplexer proposed for the invention, with two duplexers which are connected to a common antenna terminal.

FIG. 1 shows a quadplexer circuit in which a first duplexer DPX1 and a second duplexer DPX2 are connected to a common antenna terminal AT. In the first mixed transmitting and receive path TRP1 and the first duplexer DPX1, a first phase shifter circuit PS1 is arranged while a second phase shifter circuit PS2 is arranged in the second mixed transmitting and receive path TRP2 between the antenna terminal AT and the second duplexer DPX2. The phase shifter circuits PS have the effect that the input impedances ZI in a mixed transmitting and receive path TRP are high for signals of the other duplexer in each case, which is effected by the impedance of the respective other signal being rotated towards infinity. Correspondingly, the input impedance ZI1 in the first mixed transmitting and receive path TRP1 is high for signals of the second duplexer DPX2. Correspondingly, the input impedance ZI2 is high for signals of the first duplexer DPX1 in the second mixed transmitting and receive path TRP2. The phase shifters are adjusted in such a manner that, e.g., the phase shifter PS1 rotates the impedance of signals of the second duplexer DPX2 in such a manner that the first duplexer DPX1 is loaded as little as possible, i.e., the signals of the second duplexer are reflected as well as possible. This correspondingly applies to the second phase shifter PS2 with exchanged allocations.

Using such a quadplexer circuit, it becomes possible to isolate duplexers having closely adjacent frequency bands cleanly with respect to one another in order to provide for undisturbed quadplexer operation. Naturally, the quadplexer also supports a triplexer operation if full duplex operation is running via the first duplexer DPX1 while the second duplexer DPX2 is only used as transmit filter or only as receive filter. Such a triplexer operation corresponds to the carrier aggregation mode for which no separate transmit or receive filters are required for the individual band coupled thereto with the proposed architecture. According to the invention, the quadplexer circuit, instead, uses the second duplexer as filter in CA mode for the additional band.

Figure 2:
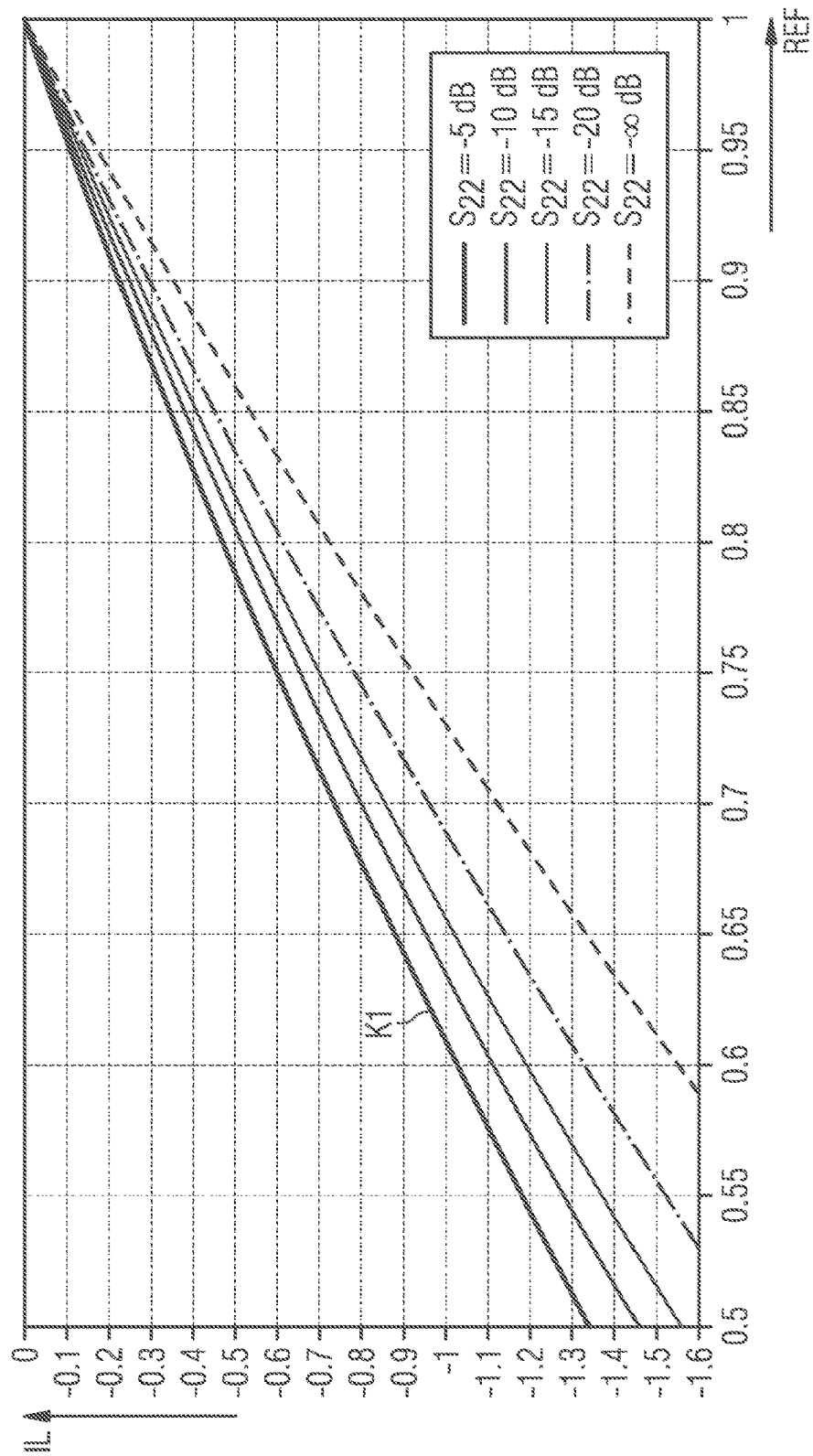
FIG. 2 shows by means of various graphs the dependence of the losses of a first filter on the reflectivity of a second filter and on the reflectivity at the antenna terminal.

Even if a quadplexer as shown in FIG. 1 provides good isolation of the two frequency bands utilized by the duplexers with respect to one another, the quadplexer is susceptible to electrical losses due to high reflections, particularly in the triplexer or quadplexer mode. FIG. 2 illustratively shows how the losses increase with decreasing reflectivity, that is to say with reflectivity becoming poorer. This only shows the additional losses which are created by the reflectivity at the antenna terminal. The various graphs are intended for various scenarios having a different S22 value. If S22 is minimal (that is to say perfect matching, see top curve), the additional insertion loss is purely attributable to the limited reflectivity of the "other" duplexer. Any mismatch at the antenna only impairs this characteristic. The different graphs show that this curve can still be flattened slightly with optimum matching but, nevertheless, the losses increase greatly if the reflectivity drops further.

It is found that with a reflectivity of, for example, 0.8 and worse, high losses in the range of approx. 0.45 dB are already produced which, with a reflectivity of 0.6 and less, already lead to more than 1 dB degradation. The situation is also degraded further if the antenna itself has a poor reflection coefficient.

Figure 3:
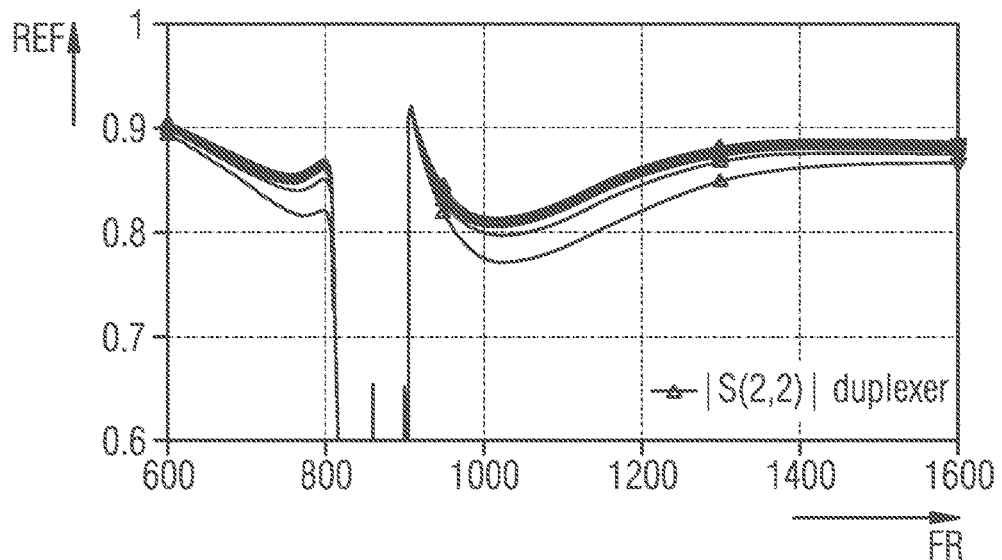
FIG. 3 shows for a duplexer known from the prior art the variation of reflectivity with the frequency in additional dependence on the quality factor of an inductance coupled close to the antenna terminal.

FIG. 3 shows the reflectivity, plotted against frequency, of a duplexer known per se which is connected to ground in series with an inductance in a first parallel branch. The various curves are allocated to inductances having different quality factors Q. The dispersion of the curves shows that a poor quality factor of this inductance can additionally degrade the reflectivity.

But even with a high-quality element having a quality of, for example, Q=300, an inadmissibly high reflectivity and, as a consequence, inadmissibly high losses is nevertheless generated at certain frequencies (see also FIG. 2) in a known duplexer.

Figure 4:
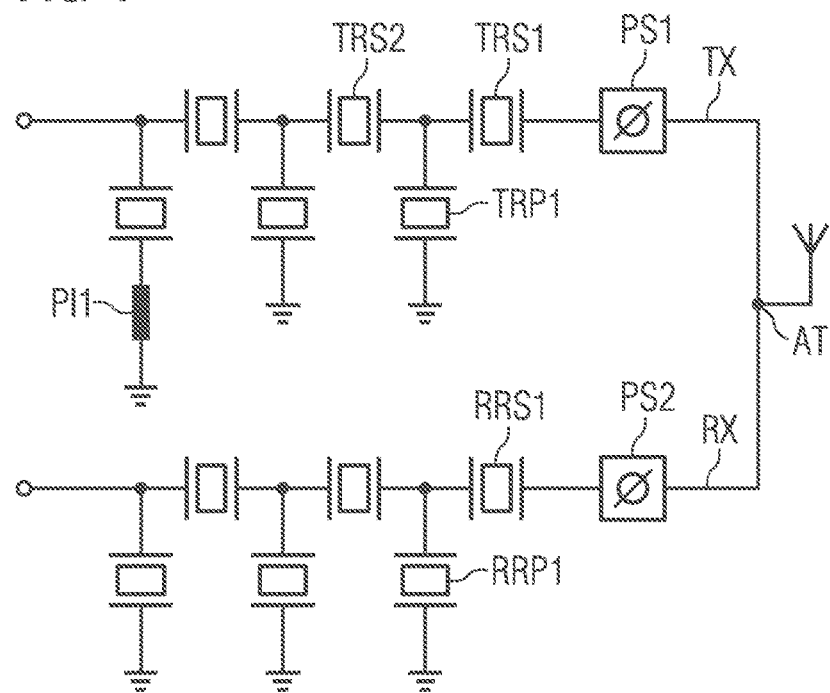
FIG. 4 shows a duplexer circuit according to the invention.

A duplexer according to the invention which significantly reduces the problem of too high a reflectivity at the antenna terminal is shown in FIG. 4. As usual, a transmitting branch TX and a receiving branch RX are connected to the common antenna terminal AT. Both in the transmitting and in the receiving branch, a filter is in each case formed as a ladder-type interconnection of resonators. Thus, the transmitting branch comprises a series of serial resonators TRSX with respect to which parallel resonators TRPX are connected to ground in parallel branches. In the figure, three series resonators TRS1 to TRS3 and three parallel arms with parallel resonators TRP1 to TRP3 are shown. A parallel inductance PI1 is connected to ground in series with the third parallel arm. The receive filter in the RX branch RX has here a similar ladder-type structure with the same number of serial and parallel resonators RRS and RRP which differ from the transmit filter only in their resonant frequencies.

Between each of the two filters and the antenna terminal AT, a phase shifter circuit PS1, PS2 is provided which is responsible for the TX/RX isolation within the duplexer. Each phase shifter circuit comprises at least one element, selected from inductance or capacitance, which can be connected in parallel or in series with the respective branch. Phase shifter circuits can also comprise L-, T- and Π-circuits. It is also possible to implement the two phase shifter circuits in the two branches with the aid of a single phase shifter circuit.

Figure 5:
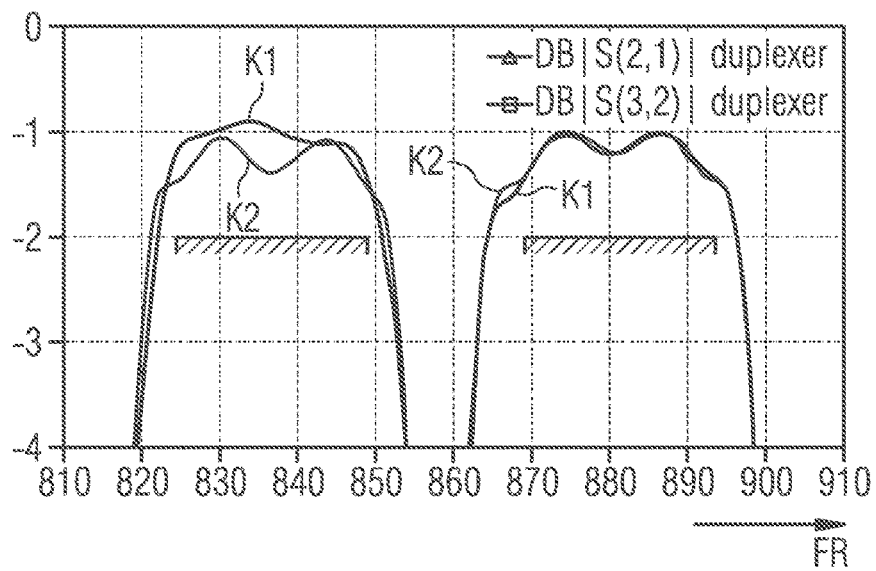
FIG. 5 shows the passband of transmit and receive filters of a duplexer according to the invention.

In FIG. 5, the curves K1, drawn more thickly, show the passbands of the duplexer shown in FIG. 4 for the transmit band and the receive band, the second curves K2 in each case showing the same filter or the same duplexer without parallel inductance. The figure shows that the additional parallel inductance leaves bandwidth and edges of the passbands almost unchanged.

Figure 6:
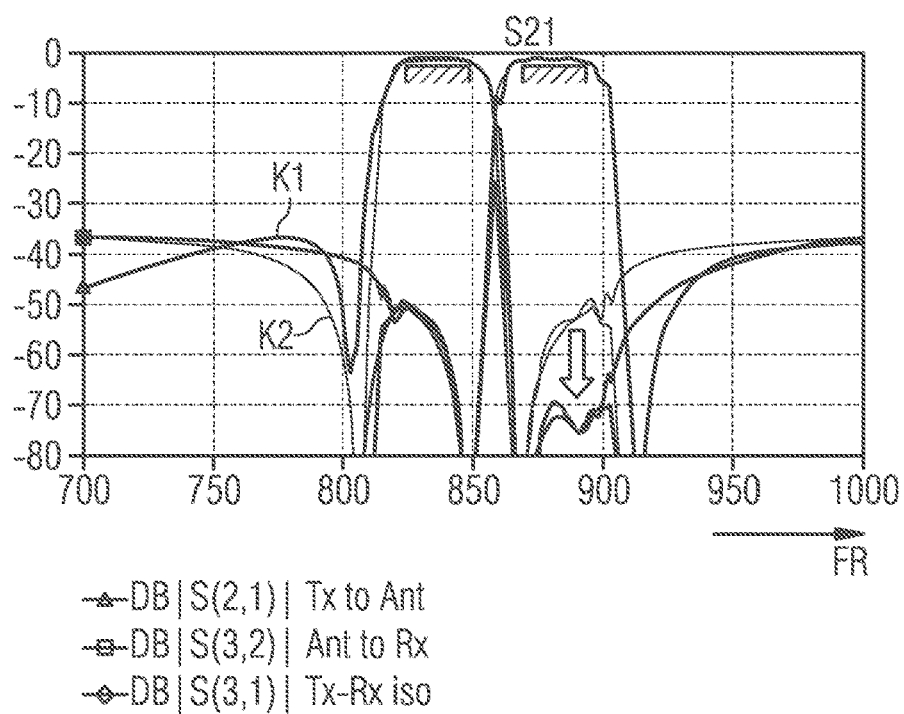
FIG. 6 shows the transfer characteristic of the duplexer according to the invention in comparison with a known duplexer.

However, what is improved with the additional inductance is the TX/RX isolation in the passband of the RX filter which is shown in FIG. 6. For the selected exemplary embodiment, an isolation improved by 20 dB is achieved. In contrast, the minimal deterioration in the passband of the TX filter is negligible and thus the positive effect of the invention is obvious.

FIG. 7 shows that virtually no influence of the Q factor of the additional inductance PI1 used on the reflectivity of the duplexer shown in FIG. 4 is visible at the intended terminal. In FIG. 7, the variation of the reflectivity for different Q values (from Q=50 to 300) of the inductance is shown above one another. There is virtually no difference between the curves. The comparison with the corresponding representation in FIG. 3 for a known duplexer shows the considerably improved reflectivity of the duplexer according to the invention. The reflection is improved by at least 0.1, especially close to the passband, shortly below and shortly above it which, according to FIG. 2, means a reduction in the insertion losses of 0.3 to 0.5 dB.

The concept according to the invention to arrange the parallel inductance as far away from the antenna terminal as possible can be extended to several inductances which are connected in series with other parallel arms. Here, too, it applies that the further inductances exhibit a maximum distance from the antenna terminal and the first parallel arm remains free of an additional inductance in every case. By means of these further inductances, additional attenuation peaks can be created at critical frequencies in order to filter out particular system frequencies.

The duplexer shown in FIG. 8 can be designed, for example, for band 17. By means of additional inductance, an increased attenuation can then be generated, that is to say an attenuation peak at the frequencies of band 5, in order to increase the TX/RX isolation between the duplexers for a possible carrier aggregation mode. A further attenuation peak can be generated at approx. 2.4 GHz in order to attenuate WLAN frequencies. In this manner, the characteristics of the duplexer according to the invention are improved further for the use thereof in a quadplexer and in this case particularly for the use in carrier aggregation mode for band 5/band 17.

Figure 9:
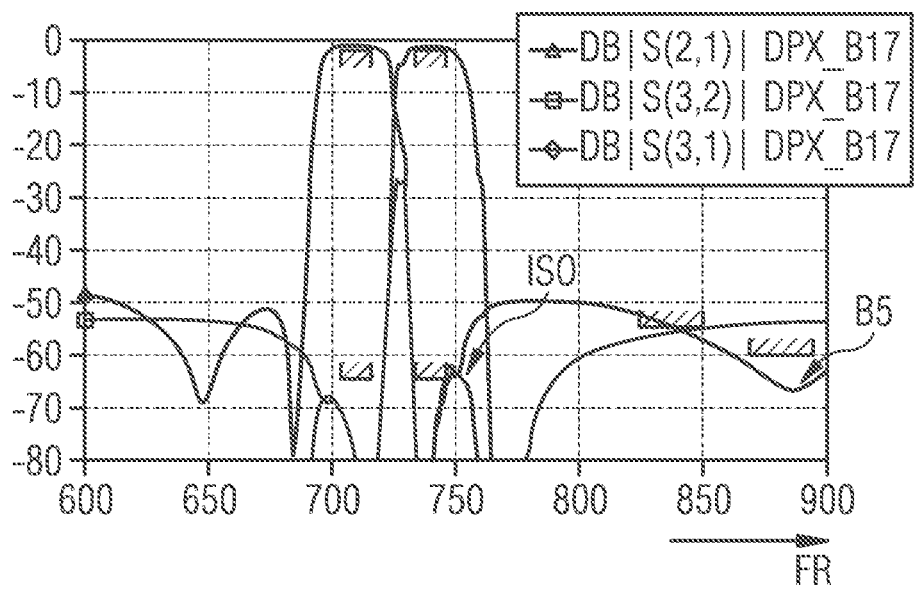
FIGS. 9 and 10 show the transfer characteristic of the duplexer according to the invention shown in FIG. 8.

FIG. 9 shows the transfer characteristic of the duplexer shown in FIG. 8 and designed for band 17 in the area of the passbands and the immediately adjacent areas, particularly a notch generated at center frequency of band 5 in this embodiment.

Figure 10:
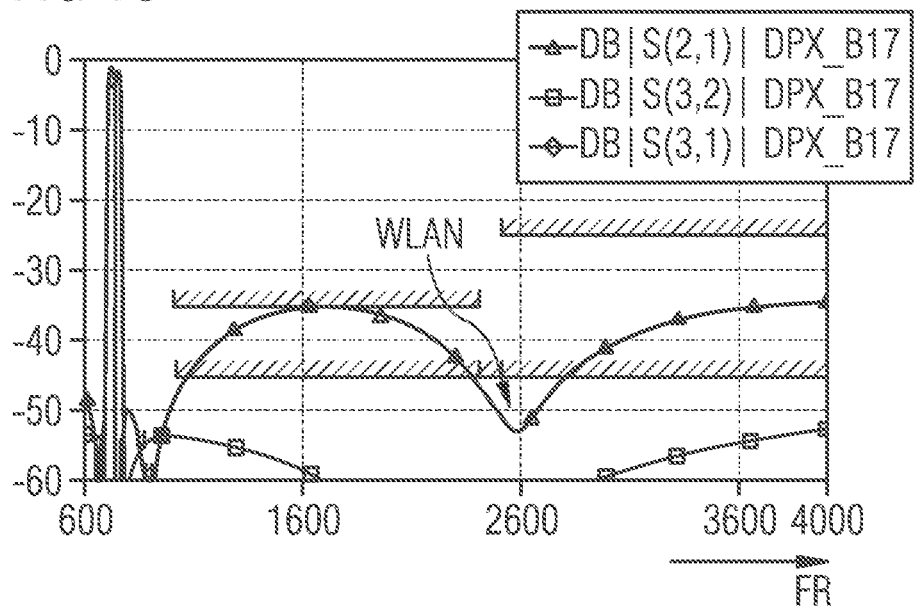

FIG. 10 shows the isolation of the duplexer in the area of the WLAN frequency at approx. 2500 MHz which is improved by the additional attenuation peak generated. In all cases, the Rx/Tx isolation ISO is improved significantly.

Figure 11:
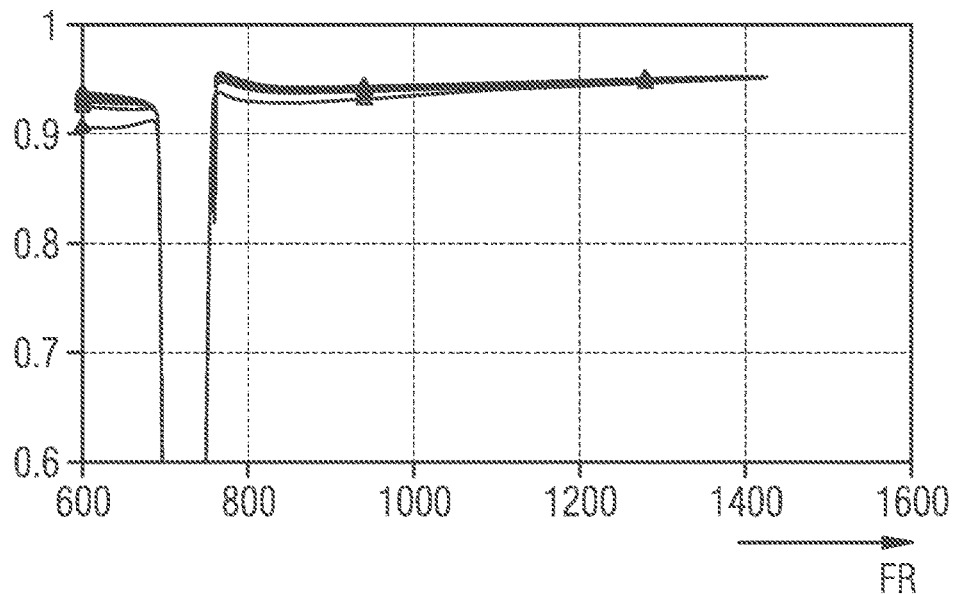
FIG. 11 shows its reflectivity with the frequency.

FIG. 11 shows the reflectivity, plotted against frequency, of the duplexer shown in FIG. 8 and designed for band 17, with the two parallel inductances. Various curves are plotted in which the quality of the inductance used varies from 50 to 300. Here, too, it is found that in spite of the second inductance, the reflectivity is changed only insignificantly particularly close to the passband and is greatly improved compared with a known duplexer. Although a dependence on the quality factor of the inductances used is found, it is, however, only defined very slightly. The graphs for duplexers in which inductances having different qualities are used show a great similarity and differ only minimally in their amounts.

Figure 12:
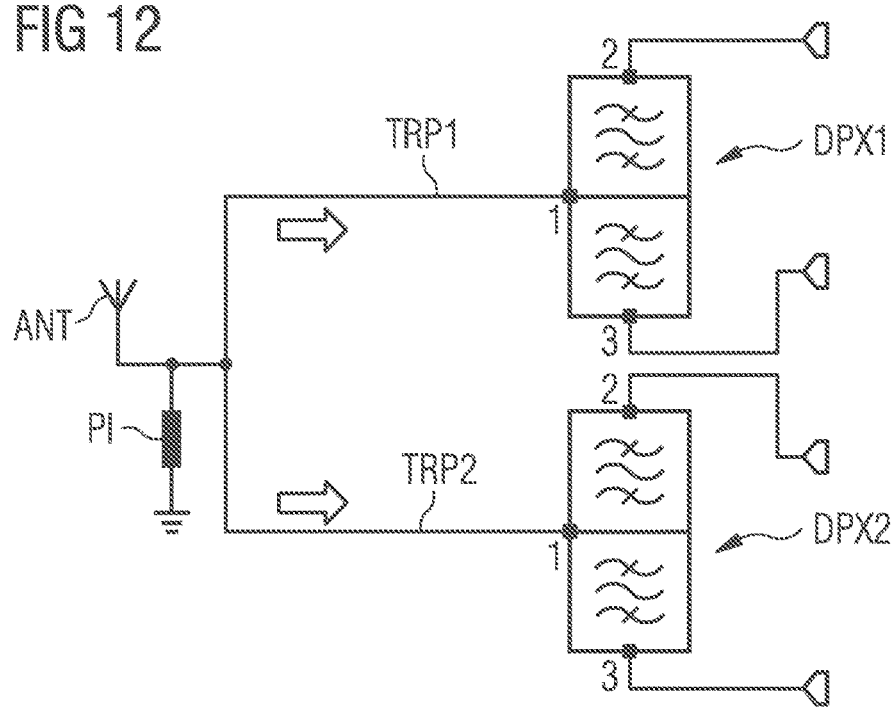
FIG. 12 shows a duplexer circuit with a phase shifter according to the invention for a special band combination.

FIG. 12 shows a simplified circuit of a band-5/band 17 quadplexer with duplexers according to the invention. For the special band combination and the duplexers according to the invention, the phase shifter circuits can be implemented by a single parallel inductance P1 which is connected to ground in parallel with the antenna terminal AT. Each of the two single duplexers DPX1, DPX2 is in this case optimized in such a manner that it has the best possible reflectivity with, at the same time, high insulation of the TX signal compared with the further RX branch coupled in CA mode. In the quadplexer of FIG. 12, the phases of the two duplexers are optimized with respect to one another in a suitable manner which additionally contributes to the success of the single phase shifter element, that is to say the parallel inductance PI. Additionally to saving elements, the loss of insertion loss is also kept as low as possible in this way.

Figure 13:
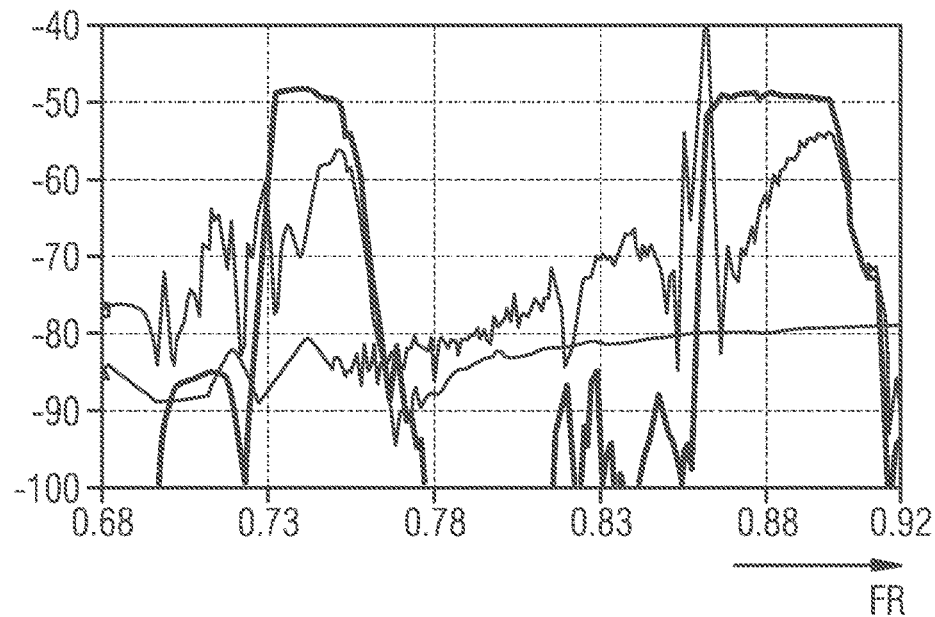
FIGS. 13 and 14 show the isolation of two duplexers according to the invention, coupled together to form a quadplexer.
Figure 14:
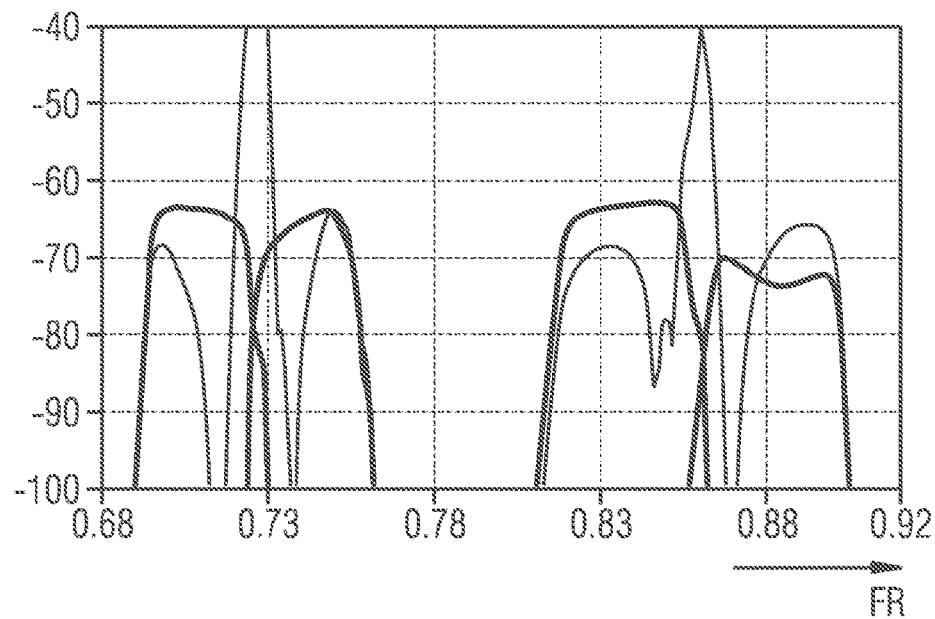

FIGS. 13 and 14 show the improved isolation which can be achieved with a quadplexer assembled from duplexers according to the invention compared with a quadplexer of known duplexers.

FIG. 13 shows the isolation for a quadplexer which has been assembled from preexisting duplexers for band 5 and band 17. None of the two duplexers have been developed with regard to carrier band aggregation so that these duplexers, or the quadplexer produced by them, have the problems already described initially. Thus, e.g., the isolation is significantly poorer in the RX band of the two duplexers than in the TX band.

In FIG. 14, the duplexers are designed according to the invention for band 5 and band 17 and are now suitable for use in carrier band aggregation mode. In the case of the quadplexer according to the invention according to FIG. 14, a significantly improved isolation is found in the respective area of the RX frequencies of both duplexers. In both bands, the isolation is now more than 60 dB and is thus improved by 20 dB and more.

By means of a comparison of the FIGS. 13 and 14, it can thus be shown that no further obvious deterioration occurs in the RX range due to the in each case second duplexer in a quadplexer mode or in a carrier aggregation mode as is observed also according to FIG. 13 with known quadplexers or in the case of quadplexers which have been produced from known duplexers.

The invention has only been described by means of a few exemplary embodiments and, therefore, is not restricted to these. Duplexers according to the invention can also be optimized for other LTE bands and suitable duplexers can be interconnected to form quadplexers. In this context, the band combinations listed, for example, in FIG. 15A and proposed by the 3 GPP in a current release are also supported for carrier aggregation mode in the FDD Rx range. FIG. 15B shows the corresponding band combinations proposed by the 3 GPP (TS36.101) for Interband Carrier Aggregation for Tx FDD bands. FIG. 15C shows the proposed corresponding band combinations for Interband Carrier Aggregation for Tx TDD bands.

For the CA modes contained in FIG. 15A which combine three different bands, it applies that, in this context, in each case only two bands are in each case adjacent to one another so closely that a quadplexer constructed of duplexers according to the invention has to be used. The frequency location of the third band is remote sufficiently far away from that of the other two bands so that a simple diplexer is sufficient for separating them, which can be connected upstream of the quadplexer.

Due to the significantly improved isolation of duplexers according to the invention, no further deterioration is observed in the passband and particularly in the respective RX band of the duplexers also in the carrier aggregation mode in which two duplexers are aggregated and operated simultaneously at the same antenna terminal.

Actually, a duplexer according to the invention can also be operated exclusively in pure duplex mode or alternatively in duplex or quadplex mode.

The invention claimed is:
1. A duplexer comprising:
an antenna terminal; and
two sub-paths including a transmit path and a receive path, the two sub-paths connected to the antenna terminal, wherein:
the transmit path comprises:
at least one phase shifter; and
serially interconnected series resonators and, in parallel therewith,
n parallel paths connected to ground;

each parallel path comprises one parallel resonator or a cascade of serially interconnected parallel resonators;

n is an integral number with 0<n<8;

at least one of the n parallel resonators is connected to ground in series with an inductance in the transmit path; and a parallel resonator is connected directly to ground in a first parallel path that is nearest to the antenna terminal and no inductance is arranged in the first parallel path;

the antenna terminal is coupled with one or more of:
at least one further transmit branch having a further transmit filter:
a further receive branch having a further receive filter; or
a further duplexer;

the at least one phase shifter is arranged between at least one of:
the antenna terminal and the duplexer;
the antenna terminal and the further branch; or
the antenna terminal and the further duplexer;

the at least one phase shifter is configured to, at a duplexer input, rotate an impedance towards infinity for frequencies of the further receive branch, the further transmit branch, or the further duplexer;

the duplexer is configured to operate in a carrier aggregation mode; and the carrier aggregation mode provides for:
transmitting and receiving operation via the transmit path and the receive path of the duplexer; and
at least one of:
receive operation via the further receive filter;
transmit operation via the further transmit filter; or
at least one receive operation by the receive filter of the further duplexer or transmit operation by the transmit filter of the further duplexer.

2. The duplexer according to claim 1, wherein a first inductance is arranged in the parallel path of the transmit path that is furthest away from the antenna terminal.

3. The duplexer according to claim 1, wherein a second inductance is connected in series with a further parallel resonator in the duplexer, wherein the second inductance is dimensioned such that an increased attenuation at a further system frequency is effected in a transfer curve, and wherein the further system frequency is selected from wireless local area network (WLAN), wireless fidelity (WiFi), global positioning satellite (GPS), or from a transmit (Tx) or receive (Rx) band of any other communication or navigation band.

4. The duplexer according to claim 1, wherein:
the duplexer is connected to a second duplexer of the same type to form a quadplexer;
the duplexer is configured to operate in a first transmit band and a first receive band;
the second duplexer is configured to operate in a second transmit band and a second receive band which are different from the first transmit band and the first receive band of the duplexer;
a first phase shifter circuit is connected between an antenna terminal and the duplexer and a second phase shifter circuit is connected between the antenna terminal and the second duplexer;
the first phase shifter circuit is configured to rotate an impedance for frequencies towards infinity in the first transmit band and the first receive band of the duplexer;
the second phase shifter circuit is configured to rotate an impedance for frequencies towards infinity in the second transmit band and the second receive band of the second duplexer;
a transmit path of the second duplexer comprises serially interconnected series resonators and, in parallel therewith, parallel paths connected to ground;
each parallel path of the transmit path of the second duplexer comprises at least one parallel resonator or a cascade of serially interconnected parallel resonators;
at least one of the parallel paths of the transmit path of the second duplexer is connected to ground in series with an inductance; and
the at least one parallel resonator is connected directly to ground in a first parallel path of the transmit path of the second duplexer that is nearest to the antenna terminal and no inductance is arranged in the first parallel path of the transmit path of the second duplexer.

5. A quadplexer comprising:
an antenna terminal;
a first duplexer and a second duplexer coupled with the antennal terminal, wherein each of the first duplexer and the second duplexer comprises:
two sub-paths including a transmit path and a receive path, the two sub-paths connected to the antenna terminal, wherein:
the transmit path comprises serially interconnected series resonators and, in parallel therewith, n parallel paths connected to ground;
each parallel path comprises one parallel resonator or a cascade of serially interconnected parallel resonators;
n is an integral number with 0<n<8;
at least one of the n parallel resonators is connected to ground in series with an inductance in the transmit path; and
a parallel resonator is connected directly to ground in a first parallel path that is nearest to the antenna terminal and no inductance is arranged in the first parallel path;
wherein:
the first duplexer is configured to operate on a first transmit band and a first receive band;
the second duplexer is configured to operate on second transmit band and a second receive band, the second transmit band and the second receive band being different from the first transmit band and the first receive band; and
the quadplexer further comprises:
a first phase shifter circuit connected between the antenna terminal and the first duplexer, the first phase shifter circuit being configured to rotate an impedance for frequencies towards infinity in the bands of the second duplexer; and
a second phase shifter circuit connected between the antenna terminal and the second duplexer, the second phase shifter circuit being configured to rotate an impedance for frequencies towards infinity in the bands of the first duplexer.

6. The quadplexer according to claim 5, wherein the first duplexer is configured to operate on a long term evolution (LTE) band $B_5$ and the second duplexer is configured to operate on an LTE band $B_{17}$, and wherein an inductance is arranged as a phase shifter in a parallel branch which is connected to ground in parallel with the antenna terminal.

7. The quadplexer according to claim 5, wherein the first duplexer is configured to operate on a band X while the second duplexer is configured to operate on a band Y, and wherein a center frequency $f_{c1}$ in a receive band of the band X is linked to a center frequency $f_{c2}$ in a receive band of the band Y via the relation $fc1 \leq 1.45\ f_{c2}$.

8. The quadplexer according to claim 7, wherein the center frequency $f_{c1}$ in the receive band of the band X is linked to the center frequency $f_{c2}$ in the receive band of the band Y via the relation $f_{c1} \leq 1.3\ f_{c2}$.

9. The quadplexer according to claim 7, wherein the center frequency $f_{c1}$ in the receive band of the band X is linked to the center frequency $f_{c2}$ in the receive band of the band Y via the relation $f_{c1} \leq 1.2\ f_{c2}$.

* * * * *